United States Patent [19]

Maury

[11] 4,178,560

[45] Dec. 11, 1979

[54] PHASE COMPARATOR ARRANGEMENT FOR CONTROLLING AN ELECTRICAL MEMBER

[75] Inventor: Christian Maury, Velizy, France

[73] Assignee: Compagnie Internationale pour l'Informatique Cii-Honeywell Bull (Societe Anonyme), Paris, France

[21] Appl. No.: 874,053

[22] Filed: Feb. 1, 1978

[30] Foreign Application Priority Data

Feb. 7, 1977 [FR] France ................. 77 03315

[51] Int. Cl.² .......................... H03B 3/04; H03K 5/20
[52] U.S. Cl. ................. 331/1 A; 307/232; 328/133; 328/155; 331/8; 331/17; 331/27
[58] Field of Search ............ 331/1 A, 8, 25, 27, 331/17; 307/232; 328/133, 134, 155

[56] References Cited

U.S. PATENT DOCUMENTS

| 3,351,868 | 11/1967 | Farrow | 307/232 X |
| 3,755,747 | 8/1973 | Letosky | 307/232 X |

*Primary Examiner*—Siegfried H. Grimm
*Attorney, Agent, or Firm*—Cameron, Kerkam, Sutton, Stowell & Stowell

[57] ABSTRACT

A phase comparator circuit arrangement is provided for controlling an electrical member on the basis of a control signal formed in accordance with the difference detected between a first waveform which is periodic and has a constant cyclic ratio, after it has locked on to a reference signal, and a second waveform which, after this locking on for which it serves as a reference, becomes non-periodic with a variable cyclic ratio for the purposes of exerting the said control. The circuit comprises a combination of a first bistable flip-flop circuit which receives the first and second waveforms respectively and which receives enabling voltages whose evolution is complementary between one input and the other. Means to subtract the waveform emitted by the first flip-flop circuit from the first waveform are provided to form the said signal for controlling the member. A second bistable flip-flop circuit may be included which receives, respectively, the first waveform and a third waveform which is complementary to the first, and which receives enabling voltages whose evolution is complementary from one input to the other and which, in the case of at least one of them, depend on the state of the flip-flop of the first bistable flip-flop circuit. Means for inhibiting the operation of this second bistable flip-flop circuit are included with means to add the waveform emitted by the second circuit during the control phase to the first waveform, to form the said signal for controlling the member during this control phase.

17 Claims, 9 Drawing Figures

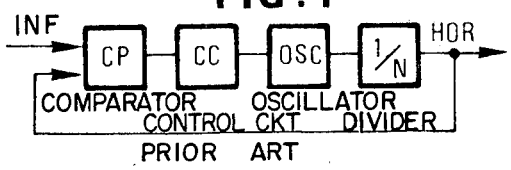
FIG:1
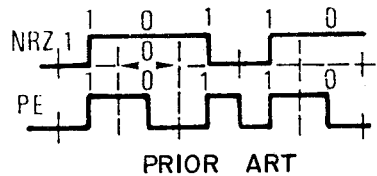
FIG:2
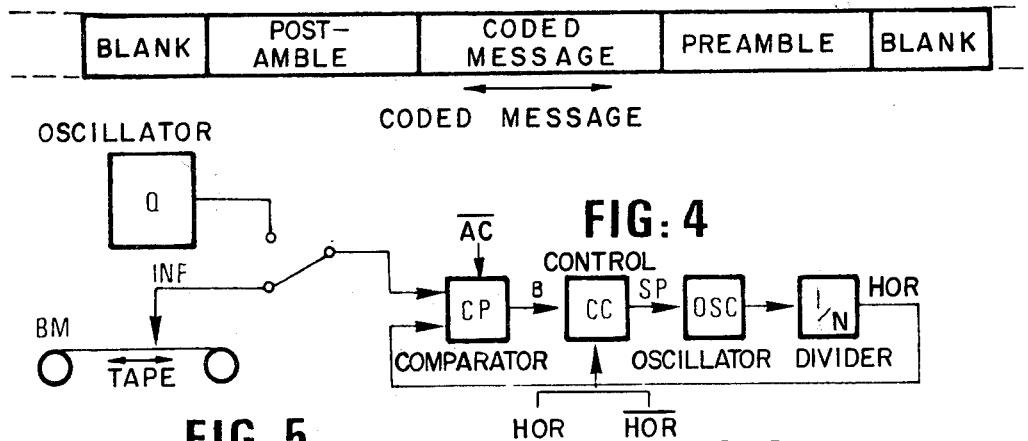
FIG:3
FIG:4
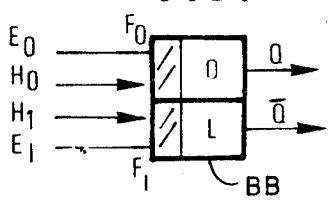
FIG:5
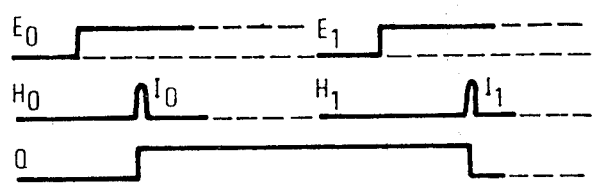
FIG:6
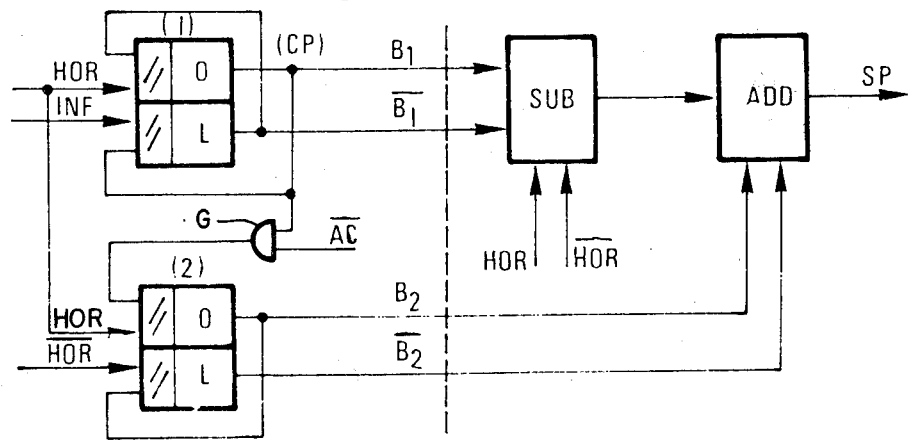
FIG:7

PHASE COMPARATOR ARRANGEMENT FOR CONTROLLING AN ELECTRICAL MEMBER

BACKGROUND OF THE INVENTION

1. Field of the Invention

The present invention relates to a phase comparator arrangement for controlling an electrical member by altering its supply in accordance with the phase difference found between two square wave and/or pulsed waveforms, and more particularly to an arrangement of this kind in which one of the waveforms represents a measurement of operating characteristics of the electrical member being controlled, and hence an arrangement which operates in a system which is looped back to an input of the phase comparator with which the system commences.

2. Description of the Prior Art

There are known phase comparator circuits, called relative phase detectors, which emit pulses whose length is modulated in proportion to the phase difference measured between two periodic square waves. Certain of these circuits make such measurements over a range of ±180°. Generally speaking, relative phase detectors of this kind employ one or two bistable flip-flops and have two outputs, one of which is assigned to advances in relative phase and the other to lags. Such a phase difference detector is described in French patent application No. 74 12745, the introduction to which also reviews structures antedating that which the patent proposes.

This patent provides a brief description of the system in which its phase difference detector is intended to operate, which system is shown in outline in the block diagram in accompanying FIG. 1. Referring to FIG. 1, an oscillator OSC is follwed by a frequency divider 1/N which emits a periodic square waveform HOR. A phase comparator circuit CP receives this waveform HOR, which is termed the "measurement" waveform, and compares its phase with that of another waveform INF which is termed the "reference" waveform. The pulses (the signals for the phase difference measured) from comparator CP are applied to a control circuit CC for controlling the frequency and phase of the oscillator OSC.

However, this arrangement, like those described in the preamble to the French patent, is only practicable in arrangements wherein the "reference" waveform, like the "measurement" waveform, is a square wave and periodic. In each of these two waveforms, there is a specific, constant cyclic ratio and their mean frequencies are close to the ordered frequency of the oscillator to be controlled. Such arrangements are clearly unsuitable for dealing with non-periodic control input waveforms in which the cyclic ratio varies.

SUMMARY OF THE INVENTION

The present invention provides a phase comparator arrangement for controlling an electrical member, in particular by controlling its power supply, which is suitable for dealing with non-periodic input waveforms.

At the present time, in many data processing systems, an input signal such as INF waveform, is not merely a "reference" signal, as understood in the above-identified French patent which is intended simply to hold the frequency and phase of the oscillator at a set value and which is thus formed like the "measurement" signal, by a square wave, but is a true, control signal which is non-periodic and which alters the frequency and/or phase of the oscillator in a predetermined fashion. In this case, the INF signal either comes directly from a binary code emitter or else the control codes are recorded at an intermediate stage on a magnetic medium such as a tape, which codes are read by a selecting process programmed into the data processing system. This is the case in particular with arrangments which are adapted to extract a clock signal from a coded control signal.

These control codes each take the form of a non-periodic waveform in which the cyclic ratio is variable. There may even be edges which are of no significance in themselves if the waveform is a square wave and not simply pulsed. To give a better idea of what is meant and simply by way of illustration, two kinds of binary code which can be employed for extracting a clock signal in this way are shown in the accompanying FIG. 2. These two kinds of binary code are themselves well known in the art. The waveform marked NRZ 1 changes level only to mark the presence of a binary "1" digit in the code, which change of level may take place in either direction. The waveform marked PE changes level in one specific direction to mark the presence of a binary "1" digit in the code and in the other direction to mark the presence of a binary "0" digit in the code. In this second waveform there are non-significant "transitions" (return to zero) in addition to the significant translations (changes to "1" or changes to "0"). Other similar codes may be used which are, for example, the reverse of those shown.

A common feature of the use of such binary codes is that for interpretation they require a systematic sampling operation whose period $\theta$ is taken as defining the minimum distance between the times at which consecutive binary digits may possibly occur.

Another object of the invention is to provide an arrangement for comparing phases between a periodic wave and a non-periodic wave such that the sampling of the non-periodic wave is performed by the periodic wave itself.

However, for this it would be necessary for each binary code to be applied to the phase comparator with which the arrangement commences only when the phase and frequency of the measurement signal had already been locked to those of the sampling periods. Accordingly, a supplementary object of the invention is thus to provide an arrangement which effects this locking function, and then interprets the binary code which follows locking of the signals, using the periodic measurement signal for the sampling of the comparator.

A convenient method of ensuring the continuous application of a periodic lock on signal and then of a binary code is, as shown in FIG. 3, to cause any "coded message" to be recorded with a preceding "preamble", or better still with a surrounding "preamble" and "postamble", consisting of the said periodic lock on signal of specific cyclic ratio. The "preamble", and thus the "postamble", when provided (when the recording may in fact be read in either direction as indicated by the double headed arrow), is sufficiently long, relatively speaking, for the lock on in fact to take place while it is being read. Such a sequence of preamble, coded message and postamble may be enclosed by "blanks" which, when the full control signal generator is started up, form continuations of the "standby" periods which are provided outside the periods of reading the recording. During the stand-bys, the oscillator may be synchronized or replaced by a quartz oscillator which is switched "on" for the stand-bys and "off" for the control periods.

BRIEF DESCRIPTION OF THE DRAWINGS

The invention will be described in detail with reference to the accompanying figures.

FIG. 1 is a block diagram illustration of a known phase comparator arrangement;

FIG. 2 is an illustration of two known binary codes for extracting clock information;

FIG. 3 is a representation of a coded message suitable for use with the present invention;

FIG. 4 is a block diagram of a complete system for operating an electrical member which incorporates a control arrangement according to the present invention.

FIG. 5, is a symbolic representation of a bistable flip-flop employed in the structure of a circuit for comparing the phases of waveforms in an arrangement according to the present invention;

FIG. 6 is a diagrammatic representation of signals to explain the operation of the bistable flip-flop of FIG. 5.

FIG. 7 is an embodiment of a phase comparator which employs bistable flip-flops as shown in FIG. 5, in the system of FIG. 4.

DESCRIPTION OF THE PREFERRED EMBODIMENT(S)

Figure 8:
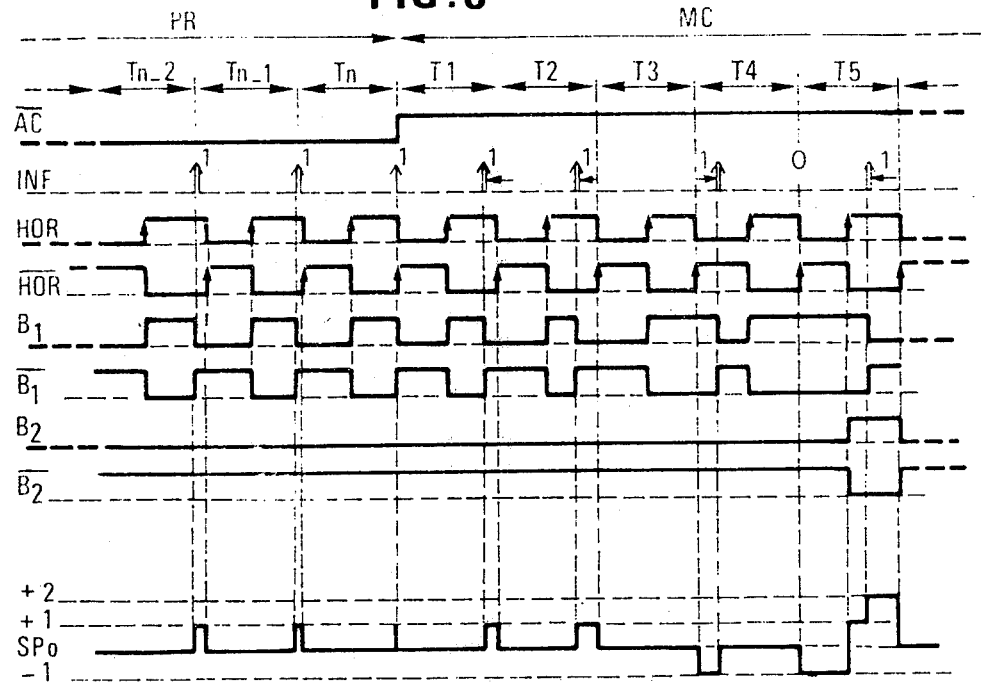
FIG. 8 represents a set of signal waveforms which relate to the embodiment of FIG. 7 and which also shows the control signal formed at the output of the phase comparator, and, FIG. 9 is a non-limiting practical block diagram illustration of an embodiment of the arrangement according to the present invention.

Referring now to FIG. 4, there is illustrated a complete system for making use of the arrangement according to the invention. The phase comparator CP receives the control signal INF as a result of the reading of a recording of the kind shown in FIG. 3 from a magnetic tape BM. During the first part of the preamble, signal AC applied to control means CC is false. Only a fraction of the preamble is, in fact, needed for lock-on to take place.

This signal AC is applied to the control means CC for a purpose which will be detailed below and which may be summarized by saying that when AC is at its true value, it enables the comparator to deal with the case where the INF signal represents a non-periodic binary code having a variable cyclic ratio.

The output signal B from the phase comparator CP is applied to a control circuit CC for forming the control signal for the oscillator OSC. This circuit CC combines the output signal B from the phase comparator CP with the "measurement" waveform HOR, as more clearly shown in FIG. 7, which waveform is extracted in the example now being described from signal INF. The actuating signal for the phase comparator CP is either the signal which is generated by a quartz oscillator Q during the standby periods or the signal INF during the periods when control is exerted.

The phase comparator of the arrangement according to the invention is based on operation of a bistable flip-flop BB shown in FIG. 5 which is of the 01 type incorporating means for applying signals to the two inputs of this flip-flop, which are referenced F0 and F1. These means may exist independently of the flip-flop proper or may on the other hand be incorporated in the flip-flop (in the case of a particular kind of flip-flop which is termed a JK flip-flop in the art). F0 receives two waveforms E0 and H0. F1 receives two waveforms E1 and H1. E0 and E1 are enabling voltages authorizing the flip-flop to operate and H0 and H1 are signals controlling this operation. Signal H0 causes the flip-flop to be set to the 0 state and signal H1 causes it to be set to the 1 state, when the authorizing voltages E0 and E1 are respectively present. The operation of the flip-flop of FIG. 5 is readily comprehensible with the help of FIG. 6. At the beginning E0 is assumed to be high and E1 low. A change in level in H0, from the low level to the high level, for example, gives a pulse I0 which drives the flip-flop to its 0 state, in which output Q becomes high (the complementary output $\overline{Q}$ will obviously become low). After this H1 goes to the high level, where E1 is already, and the flip-flop is driven to the 1 state, which returns the Q output to its low value and thus the $\overline{Q}$ output to its high value.

A flip-flop of this nature, whether its inputs F0 and F1 are in the form of AND gate circuits which form pulses I0 and I1 in the way described above or whether, as stated, they are incorporated in the actual structure of the flip-flop, is made use of at positions (1) and (2) in the embodiment of FIG. 7.

The bistable flip-flop (1) receives the clock signal HOR, at its upper input which form the pulses for setting to zero and, by feedback, the output voltage $\overline{B1}$ from the flip-flop. The lower input, on the other hand, receives the signal INF and likewise by feedback the output voltage B1 from the flip-flop.

Since it is not desired to limit the example to one particular coded waveform INF, line INF in FIG. 8, which figure will be described simultaneously with FIG. 7 for the sake of clarity in exposition, shows only the significant "transitions", these being the rising edges of a square wave which, beginning as a periodic wave having a specific cyclic ratio of which part is shown in interval PR, becomes a binary coded non-periodic waveform having no specific cyclic ratio which is shown, also in part, in interval MC.

The waveform HOR on the other hand is a periodic square wave since what is involved in this case is the extraction of a clock signal. Its cyclic ratio changes gradually in the interval region PR to lock on to the waveform INF, which in interval PR is periodic and has a cyclic ratio defined by the period $\overline{\theta}$, which in FIG. 8 is designated by reference character T. FIG. 8 shows the last three periods $\theta$ of interval PR and the first five periods $\theta$ of interval MC. The non-locking voltage $\overline{AC}$ changes level between $\theta n$, which is the last period of PR, and $\theta 1$, which is the first period of MC.

Because the clock signal is first of all "locked on" to the "preamble" of INF, it is then possible for waveform HOR to be used to sample the binary code. As far as flip-flop (1) is concerned the nature of the lock on is clear: each rising edge of HOR finds the flip-flop in the 1 state, and thus with $\overline{B1}$ high (true). It then resets the flip-flop to 0. There is a significant edge of INF in each period and this edge resets the flip-flop to 1 since, when it arrives, B1 is high. By way of illustration, the lock on comes to an end in the last three periods $\theta n-2$, $\theta n-1$ and $\theta n$ of PR, and INF and HOR at $\theta n$ are virtually in phase with the decaying edge of HOR and the rising edge of INF coinciding.

In period $\theta 1$ of MC, the rise in HOR sets the flip-flop to the 0 state. The phase of the transition in INF when it arrives is in advance of that of the clock signal, using the conventions adopted above, and it resets the flip-flop to 1 since it coincides with B1 being true (high). The output of B1 has thus remained true for the interval of time between the rising edge of HOR and the subsequent rising edge of INF, which time interval is shorter than the duration of a half period of $\theta$.

Operation is similar during period $\theta 2$ and hence B1 is at the true level between the rising edge of HOR and the subsequent rising edge of INF in this period. During $\theta 3$, however, the absence of a rising edge in INF means that B1 remains at the true level after the rising edge of HOR and does so until a rising edge of INF appears in $\theta 4$, with a phase lag relative to $\theta 3$, and returns voltage B1 to the false level. B1 is returned to the true level by the rising edge of HOR during this period $\theta 4$ and remains there since there is no subsequent rising edge in INF during the second half-cycle of the sampling waveform. B1 thus remains high until in $\theta 5$, which represents the second half wave of HOR, a rising edge of INF arrives which is in "advance" of the end of period $\theta 5$.

Thus, in each period, the waveform of voltage B1, and of the complementary waveform $\overline{B1}$, defines a phase difference between HOR and INF, which is an advance when the time taken by B1 to change to the true level is shorter than one positive half-cycle of HOR and which is a lag in the opposite case. In the case of period $\theta 4$, however, there is in fact no "advance" or "lag" proper, but instead no pulse at all (this would not have been so if the pulse which appears in the course of period $\theta 5$ had appeared in the first half cycle of this period, thus duplicating the lag relative to $\theta 3$ which appeared in period $\theta 4$). Compensation for this condition must therefore be provided in the arrangement since it will occur in practically any binary code and any "coded message" represented by INF.

There is thus no direct discrimination between advances and lags of the phase of INF relative to HOR in the comparator circuit of the arrangement according to the invention. The discrimination takes place at that point where the control signal SP for the oscillator is formed, i.e., at CC. The waveform of this control signal is shown at SP in FIG. 8, this waveform also showing the above-mentioned "compensation", which is performed in period $\theta 5$ of the section of the coded message which is illustrated.

To be more exact, the formation of a "normal" control signal is performed according to the present invention by subtracting waveform HOR from waveform B1, a process indicated in FIG. 7 by a subtraction circuit SUB which receives B1-$\overline{B1}$ and HOR-$\overline{HOR}$ at its inputs. This subtraction is effected by placing the waveforms HOR and B1 which are applied with the same polarities in opposition. Block SUB thus represents a conventional circuit for normalizing amplitude and then for analog subtraction. As can be seen from line SP of FIG. 8, control oscillator OSC relative phase advances are indicated by "positive" pulses whose individual lengths are proportional to the magnitude of the differences, while phase lags are indicated by "negative" pulses whose individual lengths are similarly proportional to the magnitude on the differences.

For the above-mentioned compensation of the other hand, a waveform as shown at B2-$\overline{B2}$ needs to be "added" to waveform HOR. This is done after the analog subtraction in FIG. 7 has been performed, by applying waveform B2-$\overline{B2}$ to the waveform emerging from the analog subtractor SUB in a conventional adder circuit marked ADD whose output represents the complete waveform SP of the control signal.

The compensating waveform B2-$\overline{B2}$ is generated by a bistable flip-flop (2) which is of the same nature as the bistable flip-flop (1) and which receives, at its input, the clock signal HOR which sets to the 0 state and also an authorizing signal, from output B1 of flip-flop (1), when the system is no longer in the locked on condition, that is to say, when $\overline{AC}$ is true. For this purpose, there is a two input AND gate circuit G which receives one input from the output B1 of flip-flop (1) and other input is the $\overline{AC}$ control signal. The output of G is applied to the input to flip-flop (2) which authorizes the action in response to the signal HOR (FIG. 7), i.e. enables flip-flop (2). The other input of flip-flop (2) receives signal $\overline{HOR}$ and an authorizing or enabling signal B2. Thus, the second input will drive flip-flop (2) to the 1 state when a rising edge of $\overline{HOR}$ finds the flip-flop in the 0 state.

It is only possible for the waveform from output B2 of flip-flop (2) to become true (high) when there is temporal coincidence between a high value of B1 and the arrival of a rising edge of HOR. It will be reset to the low level by any rising edge of $\overline{HOR}$ which coincides with a period of time when output B2 is high. In the code shown in FIG. 8, B2 will thus be high only in period $\theta 5$ during the positive half-cycle of HOR in this period. This will be the case in any period during which the binary code is sampled (when $\overline{AC}$ is true) when there is no significant transition between this period and the previous period of the code.

Figure 9:
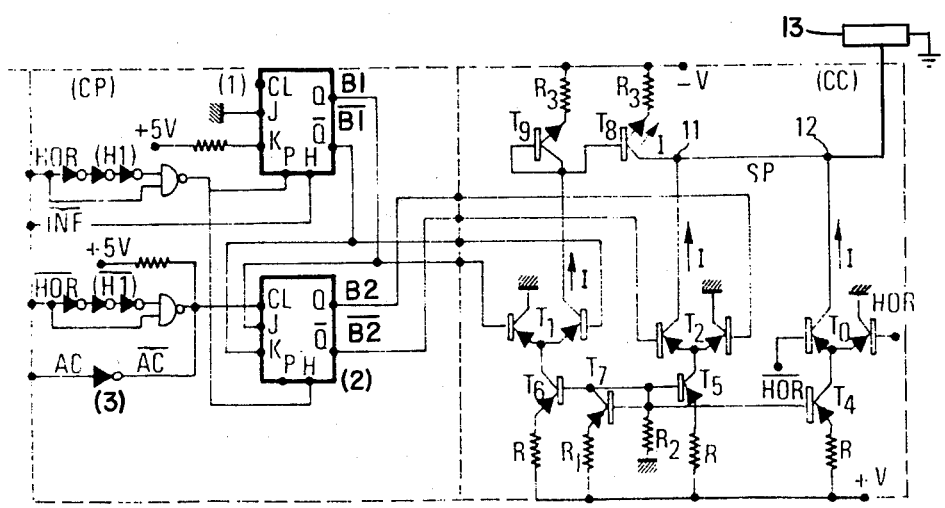

The lefthand section (CP) of FIG. 9 indicates by way of illustration, a schematic representation of one possible circuit arrangement for the comparator of FIG. 7 by using for this purpose two conventional flip-flops of the JK type which are known per se. The control inputs are automatically part of the circuits of the flip-flops, as known. A flip-flop of the JK type has two inputs bearing the designations J and K which determine its state, but a change of state only becomes effective when a pulse is supplied to the "clock" input H. Such a flip-flop also has an input CL for driving it to 0 and an input P for driving it to 1. It has two complementary outputs Q and $\overline{Q}$.

To produce the phase comparator, in the case of flip-flop (1) the J input is connected to ground and the K input is biassed by a positive voltage V of the example +5 volts. The CL input is not used. The waveform $\overline{INF}$ is applied to input H. The waveform HOR is converted into pulses corresponding to its rising edges in a pulse shaper H1 and the output of this pulse shaper is applied to input P.

In the case of flip-flop (2), the J and K inputs are connected to the Q and $\overline{Q}$ inputs respectively of flip-flop (1), which emit the voltages B1 and $\overline{B1}$. Input H receives the pulses derived from HOR and formed at $\overline{H1}$ and input CL is driven by a signal representing a combination of $\overline{AC}$ and pulses formed by pulse shaper H1 from the clock signal $\overline{HOR}$. The flip-flop is blocked when $\overline{AC}$ is not true. $\overline{AC}$ pulses are derived from the AC signal passed through an inverter (3) and applied to input CL. Operation is as described in the case of the flip-flops in FIG. 7. It is immaterial whether waveform B1 is supplied to flip-flop (2) only in unlocked periods or whether flip-flop (2) is blocked during the locked periods.

A non-limiting embodiment of control circuit CC is illustrated in the right hand portion of FIG. 9, outlined in dash lines. Circuit CC is connected directly to the comparator shown in the left hand portion of the figure, also outlined in dash lines. In this embodiment, the member to be controlled is a "load" 13, which is controlled by varying the supply current.

The load 13 is fed with current from a current source transistor T4 which has its emitter connected to a DC voltage +V via a resistor R, and a current switching circuit consisting of a pair of transistors T0 one of which has its collector connected at 12 to the supply lead to the load 13. This transistor receives the waveform HOR at its base whereas the other transistor, which receives waveform $\overline{HOR}$ at its base, has its collector grounded. T4 operates at a constant current source, having its base biassed by the load resistor of a transistor T7 which is connected as a diode, via a resistor R1, between +V and ground at the lower end of R2.

Any negative half-cycle of HOR shunts the current I to ground, while any positive half-cycle of HOR blocks this shunting and, since $\overline{HOR}$ is complementary to HOR, the current I flows and is applied to junction 12, flows through the load 13 and is returned to ground as indicated. The current generator thus supplies positive current to the load 13 at the repetition rate of the positive half cycles of HOR with a constant DC component.

However, the load 13 is also fed with current from a current source formed by a transistor T8 which has its emitter connected to voltage −V via a resistor R3 and its collector connected to the supply lead to load 13 at junction 11 which is common to junction 12. This transistor T8 is controlled by waveform B1 in the following manner: A current source circuit similar to To, T4, is formed by a "positive" current source represented by a transistor T6 which has its emitter connected to +V via a resistor R, and a current switching circuit T1 consisting of two transistors T1 of which one receives waveform $\overline{B1}$ at its base and has its collector connected to the base of T8, while the other transistor of the pair T1 has its collector grounded and receives waveform B1 at its base. Whenever B1 is low, the current through T6 will be shunted to ground. Whenever B1 is high, the current will be applied to the base of T8. The conversion of current into a voltage biassing the base of T8 is performed by transistor T9 which is connected, via a resistor R3, as a diode between −V and the collector of the switching transistor T1 whose base is controlled by $\overline{B1}$. When B1 is true there is thus a voltage dividing bridge between −V and +V, which biases the base of T8 causing the transistor to conduct. T6 has its base biassed by the collector output of T7.

Whenever B1 goes to the true state, there is established a supply to the voltage divider bridge from +V and, via T9, the base of T8 receives from −V a bias voltage which renders it conductive. Its current is applied to load 13 in opposition to, and may cancel out, the current applied from switch T0. Thus, the current I is applied to load 13 only during those portions of the positive half cycles of HOR which do not coincide with changes in B1 to the true level. The load 13 will thus receive only a small current during periods such as $\theta n-1$, $\theta n$, none at all between $\theta n$ and $\theta 1$, a small current in $\theta 1$ and $\theta 2$, and none at all in $\theta 3$. During period $\theta 4$ the load will receive a current −I during a portion of the first half cycle HOR and also during the first, negative half cycle in $\theta 5$. Thus, in interval PR the signals INF and HOR are brought into phase and in interval MC it finally brings the clock signal into another phase under the control of the binary code in INF.

However, in $\theta 5$, the addition of B2 to the HOR signal via a switching transistor T2 feeds a +1 step onto the signal applied to the load 13 from T8 at junction 11. This takes place as soon as the rising edge of HOR has passed and thus sets the level of control signal SP to +1. Then, when the rising edge of INF arrives, the drive by the HOR signal during the remainder of its positive half cycle adds a further +1 step, which brings the current level flowing through load 13 to +2 as shown in FIG. 8. By its effect on the load this provides the desired compensation.

I claim:

1. A phase comparator circuit arrangement having a lock-on phase and a control phase for developing a control signal for controlling an electrical load member wherein said control phase follows said lock-on phase, comprising a first bistable flip-flop circuit having first and second gating inputs which receive, respectively, first and second waveforms, means for connecting the first and the second gating inputs of said flip-flop circuit to receive during the lock-on phase and during the control phase voltages to enable said flip-flop, said voltages having an evolution which is complementary between said first gating input and said second gating input and being dependent upon the state of the first flip-flop circuit, and means to subtract an output waveform emitted by the first flip-flop circuit from said first waveform to develop said control signal, said control signal being dependent on the phase difference between said first waveform which is periodic and has a constant cyclic ratio after it has locked-on to a reference signal and said second waveform which serves as the reference signal and becomes non-periodic with a variable cyclic ratio for the purpose of exerting control of the load member after said first waveform has locked on the said second waveform, a second bistable flip-flop circuit having first and second gating inputs which receive, respectively, said first waveform and a third waveform which is complementary to said first waveform, means for connecting the first and second gating inputs of said second flip-flop circuit to receive voltages to enable said second flip-flop, said voltages being an evolution which is complementary between one input and the other and which, in the case of at least one of them, depends on the state of the first bistable flip-flop circuit, means for inhibiting the operation of said second bistable flip-flop circuit during the lock-on phase, and means to add a waveform emitted by an output of said second flip-flop circuit during the control phase to the output of said means to subtract to develop the said control signal for controlling the load member during the control phase.

2. An arrangement according to claim 1, wherein the inhibiting means consists of a gate circuit which is blocked in the lock-on phase and which is operably connected between an output of the first bistable flip-flop circuit and said first gating input of said second bistable flip-flop circuit.

3. An arrangement according to claim 1 wherein the inhibiting means consists of a gate circuit which is blocked in the lock-on phase and which is operably connected between an input of said second flip-flop circuit to which the third waveform is applied and a corresponding input of a bistable flip-flop element in the second flip-flop circuit.

4. An arrangement according to claim 1 wherein the means to subtract comprises a first source of electrical current and a second source of electrical current of equal values but opposite polarities, said first source having an output connected to a control circuit for controlling the load member, said second source having an output connected to said control circuit, first circuit means for switching the current from the first source, second circuit means for switching the current from the second source, and means to allow the first switching circuit means to be controlled by the first waveform and the second switching circuit means to be controlled by the output waveform emitted by the first flip-flop circuit.

5. An arrangement according to claim 1 wherein the means to develop the control signal comprises a first, a second and a third source of electrical current of the same value, said first and said second source current being of opposite polarity, said third source current being of the same polarity as the current from said first source, said first source having an output connected to a control circuit for controlling the load member, said second source having an output connected to said control circuit, first circuit means for switching the current from the first source, second circuit means for switching the current from the second source, means to allow the first switching circuit means to be controlled by the first waveform and the second switching circuit means to be controlled by the output waveform emitted by the first flip-flop circuit, a third current switching circuit having its output connected to the said control circuit, and means to allow the third switching circuit to be controlled by the output waveform emitted by the second bistable flip-flop circuit.

6. An arrangement according to claim 4 wherein the means to add a waveform comprises a third current switching circuit having its output connected to the said control circuit, and means to allow the third switching circuit to be controlled by the output waveform emitted by the second bistable flip-flop circuit.

7. An arrangement according to claim 1 wherein the voltages for enabling said first flip-flop circuit are derived from cross over feedback connections from the first and complementary outputs of a flip-flop in the first flip-flop circuit, said flip-flop circuit including pulse shaping circuits provided in its outputs for direct actuation of the flip-flop by the first and second waveforms and means applying said first and second waveforms to said pulse shaping circuits.

8. An arrangement according to claim 7 wherein the enabling voltage to the first pulse shaping input (F0) of the second bistable flip-flop circuit (2) is derived from the direct output (CP) of the first bistable flip-flop circuit (1) through a gate inhibited (AC) during a lock-on period of the arrangement, said first input (F0) further receiving the said first wave-form on the pulse shaping circuit thereof and the enabling voltage to the second pulse shaping input (F1) of the said second bistable flip-flop circuit (2) is derived from a cross-connection feedback from the direct output (B2) of the flip-flop circuit, said second input (F1) further receiving the said third wave-form.

9. An arrangement according to claim 1 wherein the first bistable flip-flop circuit includes a flip-flop element of the JK type, the first and second waveforms being respectively applied to the set to "1" and the clock input of the flip-flop element, the J and K gating inputs of the element being connected to receive biasing voltages whose effects are governed by the actual state of the flip-flop so as to authorize or block changeovers caused by the said first and second waveforms.

10. An arrangement according to claim 8 wherein the second bistable flip-flop circuit includes a flip-flop element of the JK type, the first waveform being applied to the clock input of said last named element and the third waveform to the set to "0" input, the J and K gating inputs of the last named flip-flop element being connected to the direct and complementary outputs respectively of the flip-flop element of the JK type of the first flip-flop circuit.

said first and second input means comprise pulse shaping means for shaping the said first and second waveforms and applying the shaped waveforms to the gating inputs of the first bistable flip-flop member.

11. An arrangement according to claim 1 wherein the load member to be controlled is an oscillator having its output connected to a frequency divider, the first waveform being derived from the output from the frequency divider and the second waveform adapted to be generated by a binary code generator, said second waveform having periodic lock-on sequences which alternate with non-periodic coded message sequences together with the production of a signal characteristic of the lock-on phases and of the phases of control exerted by the coded messages.

12. A phase comparator circuit arrangement having a lock-on phase and a control phase for developing a control signal for controlling an electrical load member wherein said control phase follows said lock-on phase, comprising the combination of:

first input means for receiving a first two-level waveform derived from the output of said electrical load member, said first waveform being periodic and having a constant cyclic ratio after having locked on a reference signal, second input means for receiving a second two-level waveform which serves as the said reference signal during the lock-on phase and becomes non-periodic with a variable cyclic ratio after said first wave-form has locked-on the said second waveform, circuit means for comparing the phases of the said first and second waveforms, said circuit means comprising a first bistable flip-flop member having first and second gating inputs, connected, respectively, to outputs of the said first and second input means, means for deriving first and second complementary voltages from complementary outputs of the said first bistable flip-flop member and applying said voltages to enable the said first and second gating inputs, and, means for subtracting an output waveform from said first bistable flip-flop member from said first waveform to develop a three-level control signal responsive to the phase difference between said first and second waveforms.

13. A phase comparator circuit arrangement according to claim 12 wherein:

said means for deriving and appying complementary voltages comprises cross-over feedback connections from the said complementary outputs to the said gating inputs, and said first and second input means comprises pulse shaping means for shaping the said first and second waveforms and applying the shaped waveforms to the gating inputs of the first bistable flip-flop member.

14. An arrangement according to claim 12 wherein said circuit means further includes a second bistable flip-flop member having first and second gating inputs which receive, respectively, said first waveform and a third waveform which is complementary to said first waveform, means for connecting the first and second gating inputs of said second flip-flop circuit to receive voltages to enable said second flip-flop, said voltages having an evolution which is complementary between one input and the other and which, in the case of at least one of them, depends on the state of the flip-flop of the first bistable flip-flop member, means for inhibiting the operation of said second bistable flip-flop member during the lock-on phase, and means to add a waveform emitted by an output of said second flip-flop member during the control phase to said first waveform, to develop the said control signal for controlling the load member during the control phase.

15. An arrangement according to claim 14 wherein the inhibiting means consists of a gate circuit which is blocked in the lock-on phase and which is operably connected between an output of the first bistable flip-flop member and an input of said second bistable flip-flop member and means for applying an enabling voltage to the input of said second bistable flip-flop member for enabling the second bistable flip-flop member.

16. A phase comparator circuit arrangement according to claim 14 wherein the means for subtracting comprises a first source of electrical current and a second source of electrical current of equal values but opposite polarities, a control circuit, said first source having an output connected to said control circuit for controlling the load member, said second source having an output connected to said control circuit, first circuit means for switching the current from the first source, second circuit means for switching the current from the second source, and means for controlling the first switching circuit means by the first waveform and the second switching circuit means by an output waveform emitted by the first flip-flop member.

17. A phase comparator circuit arrangement according to claim 14 wherein the first bistable flip-flop member includes a flip-flop element of the JK type, the first and second waveforms being respectively applied to the set to "1" and the clock input of the flip-flop element, the J and K gating inputs of the element being connected to receive biasing voltages whose effects are governed by the actual state of the flip-flop so as to authorize or block changeovers caused by the said first and second waveforms.

* * * * *

UNITED STATES PATENT AND TRADEMARK OFFICE
CERTIFICATE OF CORRECTION

PATENT NO. : 4,178,560
DATED : December 11, 1979
INVENTOR(S) : CHRISTIAN MAURY

It is certified that error appears in the above—identified patent and that said Letters Patent are hereby corrected as shown below:

Claim 10, Col. 10, Lines 13-17, delete lines "13-17".

Signed and Sealed this

Eleventh Day of March 1980

[SEAL]

Attest:

SIDNEY A. DIAMOND

Attesting Officer

Commissioner of Patents and Trademarks